United States Patent
Hanna et al.

(10) Patent No.: US 7,135,702 B2
(45) Date of Patent: Nov. 14, 2006

(54) ORGANIC SEMICONDUCTOR STRUCTURE, MANUFACTURING METHOD OF THE SAME, AND ORGANIC SEMICONDUCTOR DEVICE

(75) Inventors: Junichi Hanna, Yokohama (JP); Hiroaki Iino, Abiko (JP); Hiroki Maeda, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

(21) Appl. No.: 11/092,185

(22) Filed: Mar. 29, 2005

(65) Prior Publication Data

US 2006/0060840 A1    Mar. 23, 2006

(30) Foreign Application Priority Data

Mar. 31, 2004    (JP) ............................. 2004-107515

(51) Int. Cl.
*H01L 29/08*    (2006.01)
(52) U.S. Cl. .......................................... 257/40; 438/99
(58) Field of Classification Search ................. 257/40; 438/99
See application file for complete search history.

(56) References Cited

U.S. PATENT DOCUMENTS 4,939,556 A * 7/1990 Eguchi et al. ................ 257/25
6,967,352 B1 * 11/2005 Yudasaka ...................... 257/79

OTHER PUBLICATIONS

Lin et al, "Stacked Pentacene Layer Organic Thin-Film Transistors With Improved Characteristics", IEEE Electron Device Lett., vol. 18, No. 12, pp. 606-608, Dec. 1997.

Adam et al, "Transient Photoconductivity In a Discotic Liquid Crystal Display", Phys. Rev. Lett., vol. 70, No. 4, pp. 457-460, Jan. 25, 1993.

Funahashi et al, "Photoconductive Behavior In Smectic: A Phase of 2-(4'Heptytoxyphehyl)-6-Dodecylthiobenzothiazole", Jpn J Appl Phys, vol. 35, Part 2, No. 6A, pp. L703-L705, Jun. 1, 1996.

\* cited by examiner

*Primary Examiner*—Sara Crane
(74) *Attorney, Agent, or Firm*—Timothy J. Keefer; Seyfarth Shaw LLP

(57) ABSTRACT

The main object is to provide a manufacturing method of organic semiconductor, an organic semiconductor device structure manufactured by the manufacturing method and an organic semiconductor device, those having uniform and high carrier transport property over a relatively large area.

To achieve the object, the present invention provides a manufacturing method of an organic semiconductor structure, wherein the organic semiconductor structure comprises, on a base material, an organic semiconductor layer formed from a liquid crystalline organic semiconductor material, and comprising processes of: forming an oil repellent region and a lipophilic region, which is surrounded by the oil repellent region, on the base material;

coating an organic semiconductor layer forming solution, comprising the liquid crystalline organic semiconductor material and a solvent, on the lipophilic region; and crystallizing the liquid crystalline organic semiconductor material by evaporating the solvent in the organic semiconductor layer forming solution coated on the lipophilic region.

9 Claims, 6 Drawing Sheets

ORGANIC SEMICONDUCTOR STRUCTURE, MANUFACTURING METHOD OF THE SAME, AND ORGANIC SEMICONDUCTOR DEVICE

BACKGROUND OF THE INVENTION

1. Field of the Invention

The present invention relates to a manufacturing method of an organic semiconductor structure, wherein the organic semiconductor structure comprising an organic semiconductor layer formed with organic semiconductor material having liquid crystallinity, an organic semiconductor structure manufactured by the manufacturing method of and an organic semiconductor device.

2. Description of the Related Art

As a typical example of an organic semiconductor device, an organic field-effect transistor (also called organic FET) using an organic semiconductor as an active layer (hereinafter, referred to as an organic semiconductor layer) can be mentioned. In order to realize a thin film-large area device, the organic FET is required to have uniform charge carrier transport property and high carrier mobility over a sufficient large area.

In this organic FET, the organic semiconductor layer is formed, by vacuum deposition process, from molecular crystals represented by pentacene. It is reported that in a method of forming an organic semiconductor layer by vacuum deposition process, an organic semiconductor layer having high charge carrier mobility, which is greater than 1 $cm^2/V \cdot s$, can be obtained by optimizing film-manufacturing conditions. (see Y. -Y. Lin, D. J. Gundlach, S. Nelson, and T. N. Jackson, "Stacked Pentacene Layer Organic Thin-Film Transistors with Improved Characteristics", IEEE Electron Device Lett, 18,606 (1997)).

However, generally in the organic semiconductor layers formed by the above-mentioned vacuum deposition process, a large number of grain boundaries easily occur in polycrystal state of aggregated fine crystals, and further, defects easily occur so that such grain boundaries and defects inhibit transportation of charge. Accordingly, when an organic semiconductor layer is formed by vacuum deposition process, it is actually very difficult to form an organic semiconductor layer serving as an element of an organic semiconductor device continuously with uniform performance over a sufficiently large area.

On the other hand, a discotic liquid crystal is known as a material showing high charge carrier mobility (see D. Adam, F. Closss, T. Frey, D. Funhoff, D. Haarer, H. Ringsdorf, P. Schunaher, and K. Siemensmyer, Phys. Rev. Lett., 70,457 (1993)). In this discotic liquid crystal, however, transportation of charge is performed based on 1-dimensional charge transport mechanism along column-shaped molecular alignment. Thus, there is a problem that it is difficult to apply industrially because strict control of molecular alignment is required. Up to now, there is no report on a successful example of a thin-film transistor using the discotic liquid crystal as a material of an organic semiconductor layer.

It has been reported that a rod-shaped liquid crystal material such as a phenyl benzothiazole derivative also shows high charge carrier mobility in a liquid crystal state (see D. Adam, F. Closss, T. Frey, D. Funhoff, D. Haarer, H. Ringsdorf, P. Schunaher, and K. Siemensmyer, Phys. Rev. Lett., 70,457 (1993)). However, there is still no report on a successful example of a thin-film transistor using the rod-shaped liquid crystal material in an organic semiconductor layer. The rod-shaped liquid crystal material occurs in several liquid crystal states, and as the structural regularity of the liquid crystal material is increased, the mobility of charge tends to be increased. However, when this liquid crystal material is transferred into a crystal state of higher structural regularity, the mobility of charge is reversely decreased or not observed, thus naturally failing to exhibit the performance of a thin-film transistor.

When a polymer material in a molecular dispersion system is used as an organic semiconductor material, an organic semiconductor layer, which having uniform charge transport property over a large area, can be formed by coating this organic semiconductor material. However, the charge carrier mobility of the resulting organic semiconductor layer is as low as $10^{-5}$ to $10^{-6}$ $cm^2/V \cdot s$, and is problematic because of its dependency on temperature and electric field.

SUMMARY OF THE INVENTION

The present invention has solved the above-described problems. The present invention is to provide a manufacturing method of an organic semiconductor structure, wherein the organic semiconductor structure has uniform and high charge transport property over relative large area, which is conventionally said to be difficult, an organic semiconductor structure manufactured by the method and an organic semiconductor device.

In a manufacturing method of an organic semiconductor structure of the present invention, which solves the above-described problems, the organic semiconductor structure comprises, on a base material, an organic semiconductor layer formed from a liquid crystalline organic semiconductor material, and comprising processes of: forming an oil repellent region and a lipophilic region, which is surrounded by the oil repellent region, on the base material; coating an organic semiconductor layer forming solution, comprising the liquid crystalline organic semiconductor material and a solvent, on the lipophilic region; and crystallizing the liquid crystalline organic semiconductor material by evaporating the solvent in the organic semiconductor layer forming solution coated on the lipophilic region.

In the present invention, since the organic semiconductor layer forming solution comprising a liquid crystalline organic semiconductor material and a solvent is coated on a lipophilic region surrounded by an oil repellent region, the coated solution is not likely to be flowed out to the oil repellent region, and it will be in a droplet shape (semicircular arc shape). By evaporating the solvent in the coated solution in this state, the solvent is evaporated from the droplet surface, which is a part of high solvent concentration, and crystallization will begin. Therefore, a contacting area of the solvent and external gaseous phase will become smaller, so that evaporating speed of the solvent and crystallizing speed can be made extremely slow. As the result, a large crystal with few structural defects can be obtained, and the organic semiconductor layer showing uniform charge transport property over a large area can be formed. Moreover, in the present invention, since the coated organic semiconductor layer forming solution is formed on the lipophilic region, without flowing out to the oil repellent region, the organic semiconductor layer can be formed in a shape as a previously designed lipophilic region pattern.

To solve the above-described problems, an organic semiconductor structure of the present invention is an organic semiconductor structure, wherein an organic semiconductor layer in crystal phase, which is formed from a liquid crystal line organic semiconductor material, is formed on a base material, and the base material comprises an oil repellent region and a lipophilic region surrounded by the oil repellent region, and the organic semiconductor layer is formed on the lipophilic region.

In the present invention, the organic semiconductor layer can be formed into a film on the lipophilic region of the base material by, for example, a solution casting method (in this specification, it means a method in which a film is formed by coating a solution of a liquid crystal line organic semiconductor material on a base material, and evaporating a solvent contained in the solution), it is easy to obtain a large crystal with few structural defects. Therefore, since the organic semiconductor structure of the present invention can be provided with an organic semiconductor layer having uniform charge transport property over a large area, this can contribute greatly to realization of a thin film-large area device.

In the above-described organic semiconductor structure of the present invention, it is preferable that a surface of the base material, on which the organic semiconductor layer is formed, is subjected to an alignment treatment.

In the present invention, since the organic semiconductor layer is formed on the base material subjected to an alignment treatment, a liquid crystal molecule can be aligned in a specific direction or orientation.

To solve the above-described problems, organic semiconductor device according to the first embodiment of the present invention is an organic semiconductor device comprising at least: a substrate; a gate electrode; a gate-insulating layer; an organic semiconductor layer in crystal phase, which is formed from a liquid crystal line organic semiconductor material, formed on the substrate; a drain electrode; and a source electrode, wherein the substrate comprises an oil repellent region and a lipophilic region surrounded by the oil repellent region, and the organic semiconductor layer is formed on the lipophilic region.

To solve the above-described problems, organic semiconductor device according to the second embodiment of the present invention is an organic semiconductor device comprising at least: a substrate; a gate electrode; a gate-insulating layer; an organic semiconductor layer in crystal phase, which is formed from a liquid crystal line organic semiconductor material, formed on the gate-insulating layer; a drain electrode; and a source electrode, wherein the gate-insulating layer comprises an oil repellent region and a lipophilic region surrounded by the oil repellent region, and the organic semiconductor layer is formed on the lipophilic region.

In these inventions, the organic semiconductor layer can be formed on the lipophilic region of the substrate or the gate-insulating layer by, for example, a solution casting method, it is easy to obtain a large crystal with few structural defects. Therefore, since the organic semiconductor device according to the first and the second embodiments of the present invention can be provided with an organic semiconductor layer having uniform charge transport property in between the drain electrode and the source electrode, this can contribute greatly to realization of a thin film-large area device.

In the above-described organic semiconductor device of the present invention, it is preferable that the liquid crystal molecule in the liquid crystal line organic semiconductor material is aligned in parallel to a film thickness direction of the drain electrode and the source electrode formed on the gate-insulating layer.

In the above-described semiconductor device of the present invention, it is preferable that the liquid crystal molecule in the liquid crystal line organic semiconductor material is aligned in orthogonal to a film thickness direction of the drain electrode and the source electrode formed on the gate-insulating layer, also standing abreast in between the drain electrode and the source electrode.

According to the manufacturing method of organic semiconductor structure of the present invention, since an organic semiconductor layer comprising a large crystal with few structural defects can be formed, the charge transport property of the organic semiconductor layer can be uniformalized over a large area. Moreover, the organic semiconductor layer can be formed into a shape according to a previously designed lipophilic region pattern depending on electric circuits or organic semiconductor device. Further, since the organic semiconductor layer can be formed by coating a solution of an organic semiconductor material, it is easy to form organic semiconductor layer having uniform charge transport property over a large area.

According to the organic semiconductor structure and the organic semiconductor device of the present invention, since the organic semiconductor layer having uniform charge transport property over a large area can be obtained easily, this can contribute greatly to realization of a thin film-large area device.

DESCRIPTION OF THE PREFERRED EMBODIMENT

Figure 1:
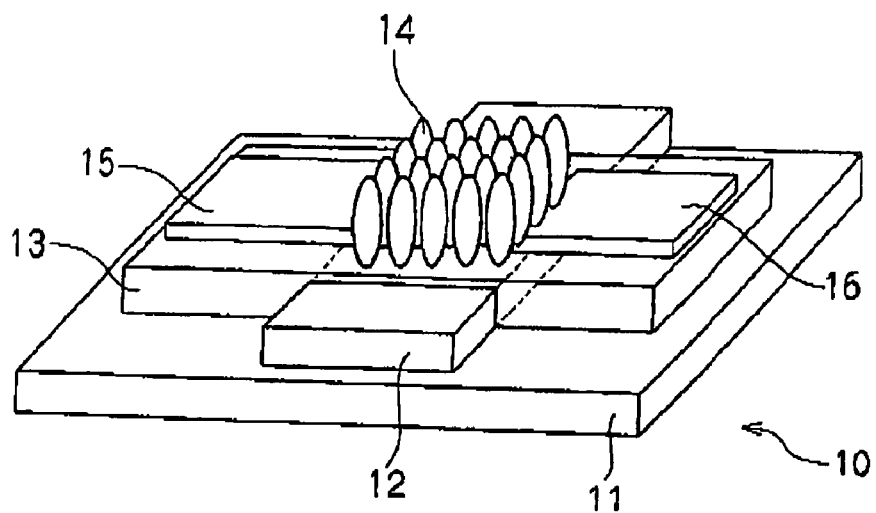
FIG. 1 is a sectional view showing one example of the organic semiconductor device of the present invention.

Hereinafter, the present invention is described by referring to the drawings. However, the present invention is not limited to the following.

1. Organic Semiconductor Device

Figure 2:
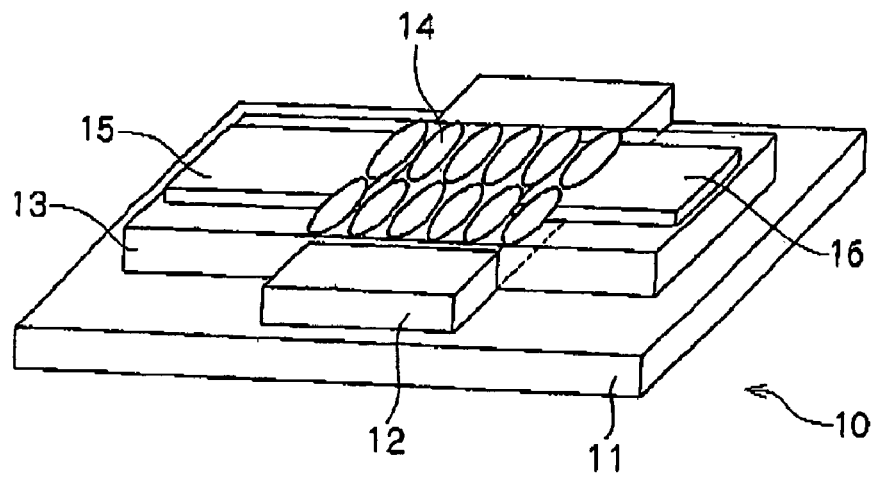
FIG. 2 is a sectional view showing another example of the organic semiconductor device of the present invention.

As shown in FIG. 1 and FIG. 2, the organic semiconductor device 10 of the present invention is composed of at least substrate 11, gate electrode 12, gate-insulating layer 13, organic semiconductor layer 14 in crystal phase, which is formed from a liquid crystal line organic semiconductor material (hereinafter, also referred to as organic semiconductor material), drain electrode 15 and source electrode 16.

Examples of the constitution include: a reverse-staggered structure constituted of, on the substrate 11, the gate electrode 12, gate-insulating layer 13, organic semiconductor layer 14 in crystal phase, which is formed from a liquid crystal line organic semiconductor material, drain electrode 15, source electrode 16 and protective layer (not shown in the figures) in this order; and a coplanar structure constituted of, on the substrate 11, the gate electrode 12, gate-insulating layer 13, drain electrode 15, source electrode 16, organic semiconductor layer 14 in crystal state, which is formed from a liquid crystalline organic semiconductor material, and a protective layer (not shown in the figure) in this order. The organic semiconductor device 10 thus constituted is actuated in either one of an accumulated and empty state, depending on the polarity of voltage applied to the gate electrode 12.

(Substrate)

The substrate 11 can be selected from a wide variety of insulating materials. Examples of such materials include: inorganic materials such as glass and calcined alumina; and various kinds of insulating materials such as polyimide film, polyester film, polyethylene film, polyphenylene sulfide film and polyparaxylene film. Particularly, a film comprising a polymer compound is extremely useful because it can be used to produce a lightweight and flexible organic semiconductor device. The thickness of substrate 11 used in the present invention is about 25 μm to 1.5 mm.

(Gate Electrode)

The gate electrode 12 is preferably an electrode comprising an organic material such as polyaniline, polythiophene etc., or an electrode formed by coating conductive ink. Since these electrodes can be formed by coating organic material or the conductive ink, there is an advantage that the electrode formation process is very easy. Specific means of coating includes spin coating method, casting method, dipping method, etc.

The electrode may be formed by conventional photolithography method. In this case, the following can be used as material for forming electrodes: metals such as gold, platinum, chromium, palladium, aluminum, indium, molybdenum, nickel and the like; alloys of these metal; and inorganic materials such as polysilicon, amorphous silicon, tin oxide, indium oxide, indiumtinoxide (ITO) and the like. Two or more of these materials can be simultaneously used.

The thickness of the gate electrode is preferably about 50 to 1000 nm depending on the electric conductivity of its material. The lower limit of thickness of the gate electrode varies according to the electric conductivity of the electrode material and adhesion to a bedding substrate. The upper limit of thickness of the gate electrode should be in such a range that, upon providing the below-mentioned gate-insulating layer and a pair of source/drain electrodes, insulating coverage by the gate-insulating layer at a portion with a level difference, between the bedding substrate and the gate electrode, is sufficient. Also, it is necessary that an electrode pattern formed thereon should not be disconnected. Particularly, when a flexible substrate is used, stress balance should be taken into consideration.

(Gate-insulating Layer)

The gate-insulating layer 13 is, similar to the gate electrode 12 described above, preferably formed by coating the organic material. As the organic material to be used, polychloropyrene, polyethylene terephthalate, polyoxymethylene, polyvinyl chloride, polyvinylidene fluoride, cyanoethyl pullulan, polymethyl methacrylate, polysulfone, polycarbonate, polyimide, polyvinyl alcohol and the like can be listed. Specific means of coating includes spin coating method, casting method, pulling method and the like.

Further, conventional patterning process such as CVD method can be used. In this case, inorganic materials such as $SiO_2$, $SiN_x$ and $Al_2O_3$ are preferably used. Two or more of these materials can be simultaneously used.

Since the mobility in the organic semiconductor device depends on the strength of an electric field, the thickness of the gate-insulating layer is preferably about 50 to 200 nm. Withstand voltage at the time is desirably 2 MV/cm or higher.

(Drain Electrode and Source Electrode)

The drain electrode 15 and source electrode 16 are preferably formed from metal of high work function. This is because the charge transporting carrier in the liquid crystalline organic semiconductor material is a hole, ohmic contact with the organic semiconductor layer 14 is necessary. The work function used herein is a potential difference necessary for taking an electron out of a solid, and is defined as a value that a difference in energy between vacuum level and fermi level is divided by a charge quantity. The work function is preferably about 4.6 to 5.2 eV, and specific materials include gold, platinum, a transparent conductive film (indium tin oxide, indium zinc oxide, etc.). The transparent conductive film can be formed by sputtering method or electron beam (EB) deposition. The thickness of the drain electrode 15 and source electrode 16 used in the present invention is about 50 to 100 nm.

(Organic Semiconductor Layer)

The organic semiconductor layer 14 is a layer comprising the crystal phase formed from the liquid crystalline organic semiconductor material.

The organic semiconductor material used in the present invention is formed from liquid crystal molecule shown in chemical formula 1 described below.

$$B\text{-}A\text{-}B' \qquad 1$$

In the above chemical formula, "A" represents a core part having skeletal structure comprising L-unit of 6 π-electron system ring, M-unit of 8 π-electron system ring, N-unit of 10 π-electron system ring, O-unit of 12 π-electron system ring, P-unit of 14 π-electron system ring, Q-unit of 16 π-electron system ring, R-unit of 8 π-electron system ring, S-unit of 20 π-electron system ring, T-unit of 22 π-electron system ring, U-unit of 24 π-electron system ring and V-unit of 26 π-electron system ring (wherein L, M, N, O, P, Q, R, S, T, U and V each represent an integer of 0 to 12, and L+M+N+O+P+Q+R+S+T+U+V=1 to 12). Moreover, B and B' in the above chemical formula represent a chain structure with high flexibility or functional group such as hydrogen and halogen.

Referring to "A" of the liquid crystal molecule shown in the above chemical formula 1, the 6 π-electron system ring includes, for example, a benzene ring, furan ring, thiophene ring, pyrrole ring, 2H-pyran ring, 4H-thiopyran ring, pyridine ring, oxazole ring, isoxazole ring, thiazole ring, isothiazole ring, furazane ring, imidazole ring, pyrazole ring, pyrazine ring, pyrimidine ring, pyridazine ring and troboron ring. The 8 π-electron system ring includes, for example, a pentalene ring, indene ring, indolizine ring and 4H-quinoline ring. The 10 π-electron system ring includes, for example, a naphthalene ring, azulene ring, benzofuran ring, isobenzofuran ring, 1-benzothiophene ring, 2-benzothiophene ring, indole ring, isoindole ring, 2H-chromene ring, 1H-2-benzopyran ring, quinoline ring, isoquinoline ring, 1,8-naphthyridine ring, benzimidazole ring, 1H-indazole ring, benzoxazole ring, benzothiazole ring, quinoxaline ring, quinazoline ring, cinnoline ring, pteridine ring, purine ring and phthalazine ring. The 12 π-electron system ring includes, for example, a heptalene ring, biphenylene ring, as-indacin ring, s-indacin ring, acenaphthylene ring, fluorene ring and phenalene ring. The 14 π-electron system ring includes, for example, a phenanthrene ring, anthracene ring, carbazole ring, xanthene ring, acridine ring, phenanthridine ring, pyrimidine ring, 1,10-phenanthroline ring, phenazine ring, phenarsazine ring and tetrathiafulvalene ring. The 16 π-electron system ring includes, for example, a fluoranthene ring, acephenanthrylene ring, aceanthrylene ring, pyrene ring, thianthrene ring, phenoxathiine ring, phenoxazine ring and phenothiazine ring. The 18 π-electron system ring includes, for example, a triphenylene ring, chrysene ring, naphthacene ring and pleiadene ring. The 20 π-electron system ring includes, for example, a perylene ring. The 22 π-electron system ring includes, for example, a piceine ring, pentaphene ring and pentacene ring. The 24 π-electron system ring includes, for example, a tetraphenylene ring and coronene ring. The 26 π-electron system ring includes, for example, a hexaphene ring, hexacene ring and rubicene ring.

Among the liquid crystal molecules shown in the above chemical formula 1, the liquid crystalline organic semiconductor materials used in the present invention are those having at least one kind of liquid crystal state at a temperature of not higher than the thermal decomposition temperature thereof. The phrase "at a temperature of not higher than the thermal decomposition temperature thereof" means that the material is in such a state that the material itself is not decomposed. The thermal decomposition temperature varies depending on the material used. The phrase "those having at least one kind of liquid crystal state" means that a material having at least one kind of liquid crystal state is used. For example, in smectic liquid crystal phase (hereinafter, also referred to as Sm) described later have plural kinds of liquid crystal states such as SmA phase, SmB phase, SmC phase, etc., and the material referred to the above is meant to have at least one kind of such liquid crystal states. As such liquid crystal molecules, liquid crystal molecules of which "A" in the above chemical formula 1 having skeletal structure shown in the following chemical formulae 2 to 36 can be listed.

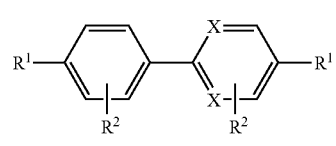

2

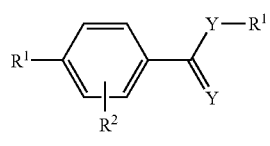

3

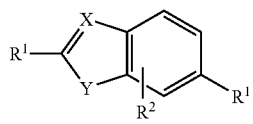

4

-continued

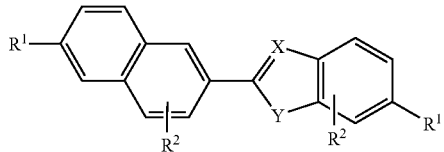

5

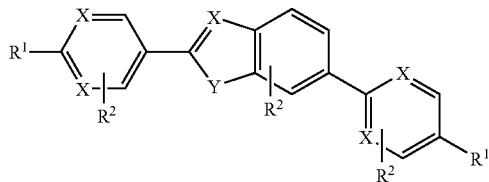

6

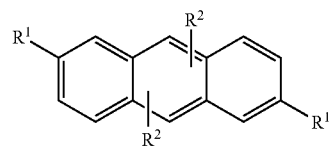

7

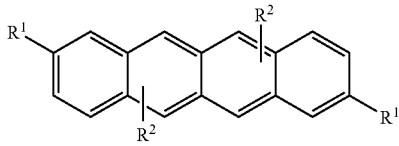

8

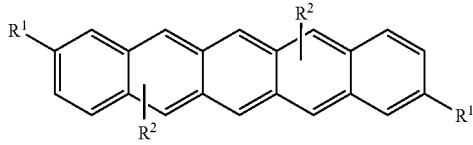

9

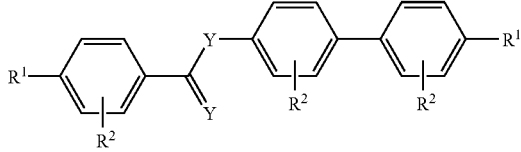

10

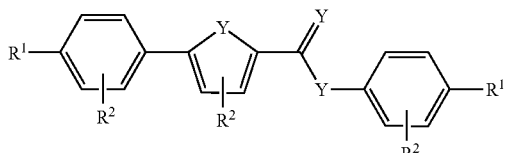

11

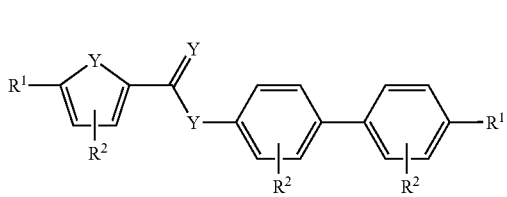

12

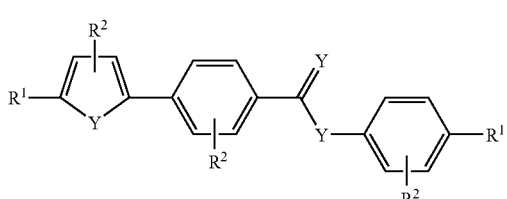

13

-continued

-continued

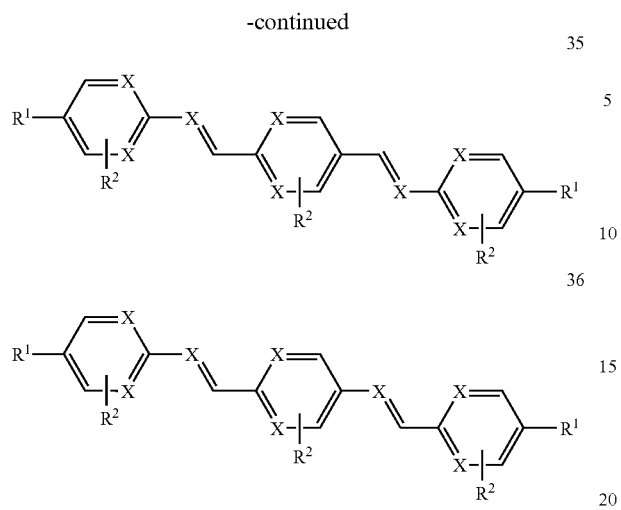

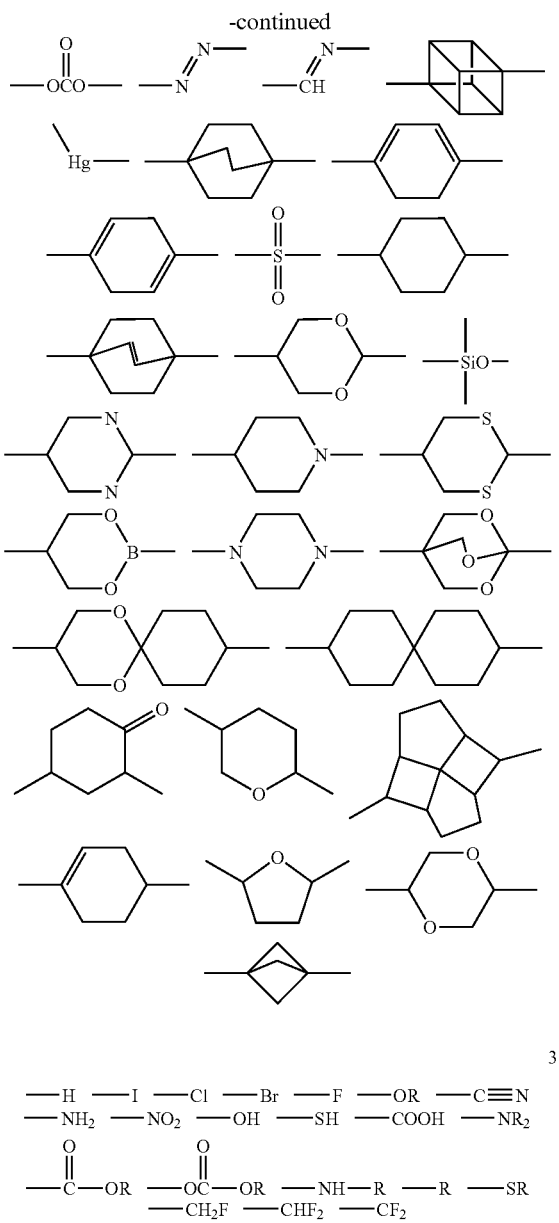

$R^1$ in the above chemical formulae 2 to 36 represents a divalent structure shown in the chemical formula 37 below, which is a linking group for linking with another skeleton. When a plurality of $R^1$s are present in these liquid crystal molecules, the $R^1$s may be the same or different. $R^1$ may not be present in the liquid crystal molecules. $R^2$ in the above chemical formulae 2 to 36 represents a functional group shown in the chemical formula 38 below. When a plurality of $R^2$s are present in these liquid crystal molecules, the $R^2$s may be the same or different. X in the above chemical formulae 2 to 36 represents CH or N, and Y in the above chemical formulae 2 to 36 represents S or O.

B and B' in the above chemical formula 1 is a chain structure with high flexibility or a functional group such as hydrogen and halogen. The chain structure with high flexibility is basically a linear alkyl chain or branched alkyl chain, and this alkyl chain may contain a structure selected from the group of 39 divalent structures shown in the chemical formula 37 below. The chain structure with high flexibility may be consisting of structures selected from the group of 39 divalent structures shown in the chemical formula 37 below. In this case, the chain structure with high flexibility may be composed of one structure selected from the group, or may be composed of a plurality of structures, which are selected from the group, linked in a linear or branched form. These chain structures with high flexibility may have a functional group selected from the group of 21 functional groups illustrated as substituent groups in the chemical formula 38 below. In cases in which B and B' in the above chemical formula 1 do not have the chain structure with high flexibility, they will be one of the 21 functional groups shown in the chemical formula 38 below.

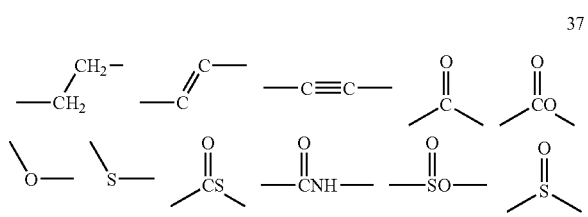

R in the above chemical formula 38 represents linear or branched alkyl group of 1 to 40 carbon atoms.

Among the above-described organic semiconductor material comprising the liquid crystal molecule, the organic semiconductor material having the following characteristics is used in the present invention. That is, the organic semiconductor material which forms crystal with few structural defect over a large area, when a crystal phase is formed by coating a organic semiconductor layer forming solution, comprising this organic semiconductor material and an organic solvent, on a base material on which a lipophilic pattern and an oil repellent pattern is formed, and evaporating the solvent. In the present specification, the term "base material" refers to a member on which an organic semiconductor layer is to be formed, and specifically to a substrate 11, a gate insulating layer 13 etc. forming the organic semiconductor device.

One example of the organic semiconductor material used in the present invention includes, for example, compounds 39 and 40 represented by the following chemical formulae;

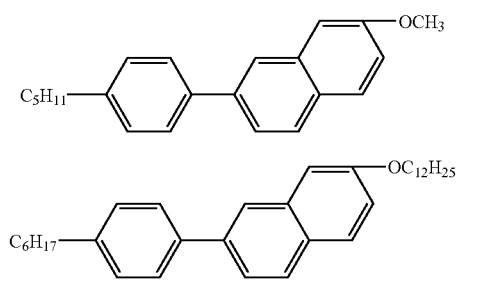

The above-mentioned organic solvent is preferably the one that the solubility of the organic semiconductor material is high enough so as to enable growth of large crystals with few structural defects. The organic solvent is selected in relation to the solubility of the organic semiconductor material used. For example, when the compound of chemical formula 39 or 40 above is used as the organic semiconductor material, an organic solvent such as xylene, toluene, hexane, butanol, acetone or chloroform can be selected.

The concentration of the organic semiconductor layer forming solution, comprising an organic semiconductor material and an organic solvent, is preferably a concentration at which large crystals with few structural defects can grow, and the optimum concentration is selected depending on the organic semiconductor material and organic solvent used.

In the organic semiconductor device 10 of the present invention, the organic semiconductor layer is formed on a lipophilic region of a base material (for example, the surface of the gate insulating layer 13) having a lipophilic region and an oil repellent region. The lipophilic region on which the organic semiconductor layer 14 is formed is in a state surrounded by at least the oil repellent region. In the present specification, the phrase "having a lipophilic region and an oil repellent region" refers to having regions that are different from each other in wettability to an organic solvent. In the organic semiconductor device 10 of the present invention, it is preferable that there is a difference in wettability, to an organic solvent, to an extent as to distinguish the lipophilic region and the oil repellent region from each other. If there is a difference in wettability, to an organic solvent, to an extent as to distinguish the lipophilic region and the oil repellent region from each other, when coating the organic semiconductor layer forming solution onto the lipophilic region (a region having higher wettability) on a base material, the coated solution hardly flows out to the oil repellent region (a region having lower wettability) surrounding the lipophilic region (seethe below-described FIG. 3). Therefore, an organic semiconductor layer 14 can be formed according to a previously designed lipophilic region pattern. This lipophilic region pattern is designed depending on an intended electronic circuit and semiconductor structure.

In formation of a lipophilic region and an oil repellent region on a base material, oil repellency is previously given to the whole surface of the base material (for example, the gate insulating layer 13 etc.) by alkali treatment, and then, a silane coupling agent or the like is coated to carry out a lipophilic treatment by adsorbing alkyl chains chemically. Thereafter, the alkyl chain is protected by masking the base material with a mask with a formed mask pattern (lipophilic treatment pattern) and coating a solvent containing polystyrene or the like, the mask is removed, and then, alkali treatment is carried out to remove the alkyl chains from a region to be rendered oil repellent, thus rendering that region oil repellent. Finally, the above-mentioned polystyrene or the like is dissolved to render the unmasked region lipophilic region. In this manner, the lipophilic region and oil repellent regions can be formed.

Alternatively, formation of the lipophilic region and oil repellent region on a base material can be carried out by coating a resin, which is capable of forming a region having relatively high wettability to an organic solvent and a region having relatively low wettability to the organic solvent by surface treatment, on a base material (for example, the gate insulating layer etc.) by a coating means such as spin coating or by various printing means, and then, subjecting the resin to a predetermined surface treatment. In this case, the region having relatively high wettability to the organic solvent will be a lipophilic region, and the region having relatively low wettability to the organic solvent will be as an oil repellent region.

As a resin which is capable of forming a lipophilic region and an oil repellent region by surface treatment, for example, polyimide resin for forming a vertically alignment film, and oil repellent resin such as fluorine based silicone resin can be listed.

For example, a surface treatment method using the polyimide resin includes: (i) a method wherein a base material coated with the polyimide resin is exposed to light via a mask, having a formed mask pattern (oil repellent treatment pattern) and a photocatalyst layer, thereby giving hydrophilic property only to the light-exposed region to make the region an oil repellent region; and (ii) a method wherein a base material coated with the polyimide resin containing a photocatalyst is exposed to light via a mask having a formed mask pattern (oil repellent treatment pattern) thereby giving hydrophilic property only to the light-exposed region to make the region an oil repellent region. When the oil repellent resin such as fluorine based silicone resin is used, the surface treatment can be carried out by the method (i) or (ii) above. In this case, the region of which hydrophilic property is given by light exposure will be a lipophilic region, while the light-unexposed region will be an oil repellent region. In either case, fine particles of titanium oxide, zinc oxide etc. can be used as the photocatalyst in the method (i) or (ii) above.

The organic semiconductor layer 14 is formed by coating the organic semiconductor layer forming solution onto the lipophilic region on the base material having the lipophilic and oil repellent regions and evaporating a solvent in the organic semiconductor layer forming solution thereby crystallizing the liquid crystalline organic semiconductor material. The organic semiconductor layer 14 comprises large crystals with few structural defects, and is formed according to a previously designed lipophilic region pattern. The area of the crystal is 20 mm$^2$ or more, for example, about 80 mm$^2$. The structural defect density in the bulk and the structural defect density in the interface with the base material is $10^{13}$ cm$^{-3}$ or less, for example, about $2\times10^{12}$ cm$^{-3}$. The temperature, pressure etc. of the atmosphere in which the organic semiconductor layer 14 is formed is regulated depending on the organic semiconductor material, the solvent etc. used, such that large crystals with few structural defects can grow. Such temperature and pressure are factors determining the rate of evaporation, that is, the rate of growth of crystals.

Now, the mechanism of forming the organic semiconductor layer 14 comprising large crystals with few structural defects is described.

Figure 3:
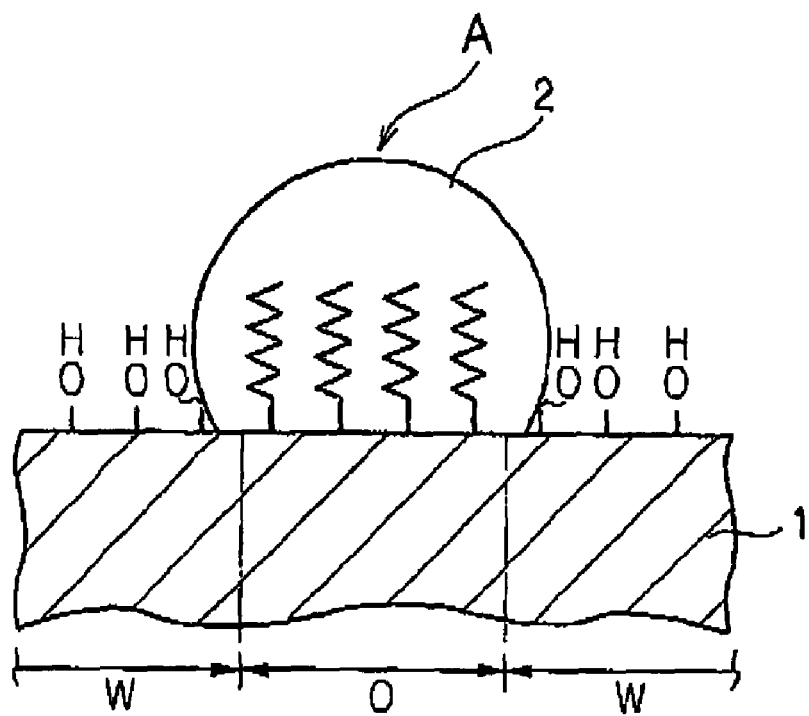
FIG. 3 is a frame format showing one example of a shape of an organic semiconductor layer forming solution coated on a lipophilic region of a base material on which a lipophilic pattern and an oil repellent pattern are formed.
Figure 4:
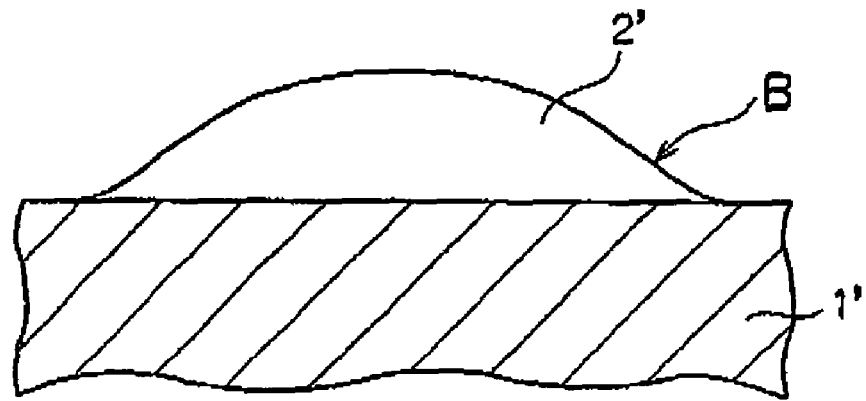
FIG. 4 is a frame format showing one example of a shape of an organic semiconductor layer forming solution coated on a lipophilic region of a base material on which an oil repellent region is not formed.

FIG. 3 is a frame format showing one example of a shape of an organic semiconductor layer forming solution coated on a lipophilic region of a base material on which a lipophilic pattern and an oil repellent pattern are formed, and FIG. 4 is a frame format showing one example of a shape of an organic semiconductor layer forming solution coated on a lipophilic region of a base material on which an oil repellent region is not formed.

As shown in FIG. 3, an organic semiconductor layer forming solution 2 coated on a lipophilic region O surrounded by an oil repellent region W on a base material 1 is in a droplet shape (semicircular arc shape). When the solvent is evaporated in this state, the evaporation starts from the upper part of the droplet shape (A in FIG. 3), which is a part of high solvent concentration, and crystallization will begin. Depending on the predetermined conditions of the external environment at this time, a relative small number of crystal nucleus are formed in the upper part of the droplet and the crystallization proceeds so as to cover the surface of the solution, using the crystal nucleus as cores. Accordingly, the contacting area of the solution and the external gaseous phase is reduced so that the evaporating speed will be extremely slow. The evaporating speed of the solvent is thus decreased to decrease the crystallizing speed of the organic semiconductor material. As a result, the organic semiconductor layer 14, comprising crystals with few structural defects over a large area, is formed. When the organic semiconductor layer forming solution is coated onto a base material 1' not having such a hydrophobic region, the organic semiconductor layer forming solution 2' is easily fluidized to be in a flat and well wetted state, as shown in FIG. 4, and evaporation of the solvent and crystallization start from the bottom (B in FIG. 4) of the organic semiconductor layer-forming solution 2', and thus such crystals cannot be obtained.

Since the organic semiconductor layer 14 is formed from large crystals with few structural defects, the carriers are not likely to be trapped in the structural defects, thus exhibiting an effect of uniform charge transport property over a large area. The organic semiconductor layer 14 also has an effect of exhibiting high charge transporting property of charge carrier mobility as high as $10^{-3}$ to $10^{-1}$ cm$^2$/V·s. For example, when the compound shown in chemical formula 1 is used as an organic semiconductor material, and p-xylene is used as an organic solvent, the charge carrier mobility will be $10^{-3}$ to $10^{-2}$ Cm$^2$/V·s or higher.

Figure 5:
FIG. 5 is a photograph by a polarizing microscope of the organic semiconductor layer in Example 1.
Figure 7:
FIG. 7 is a photograph by a polarizing microscope of the organic semiconductor layer formed on a lipophilic region, which is surrounded by an oil repellent region, of a base material by a solution casting method, using anthracene as a material.

Further the organic semiconductor layer 14 has an effect that it can be formed into a shape according to previously designed lipophilic region pattern depending on an intended electronic circuit or semiconductor device. This effect is observed only in organic semiconductor material having liquid crystal property. FIG. 5 is a photograph by a polarizing microscope of an organic semiconductor layer in which the liquid crystalline organic semiconductor material (the compound of chemical formula 1) is formed into a film on a lipophilic region of a base material surrounded by an oil repellent region by a solvent casting method. And FIG. 7 is a photograph by a polarizing microscope of an organic semiconductor layer in which an organic semiconductor material having no liquid crystal property (anthracene) is formed into a film on a lipophilic region of a base material surrounded by an oil repellent region by a solvent casting method. As shown in FIG. 5, the organic semiconductor layer comprising the liquid crystalline organic semiconductor material is formed on the whole surface of the lipophilic region, while as shown in FIG. 7, the organic semiconductor layer comprising the organic semiconductor material having no liquid crystal property forms aggregated crystal, partially but not on the whole surface of the lipophilic region, thus failing to provide an organic semiconductor layer having a shape according to the lipophilic region pattern.

In the organic semiconductor device 10 of the present invention, the above-described organic semiconductor layer 14 is preferably formed from a liquid crystalline organic semiconductor material aligned in a specific direction or orientation by an alignment means. As compared with a conventionally known organic semiconductor layer, the organic semiconductor layer 14, which is subjected to an alignment treatment to be in crystal state, has an excellent effect that cracking or the like does not occur, has uniform charge transport property, and drawbacks such as a reduction of charge transporting speed, etc., due to the cracks do not occur.

As alignment embodiments of the liquid crystal molecule, the following embodiments can be listed as examples: (A) a alignment embodiment in which the liquid crystal molecule is aligned in parallel to a film thickness direction of the drain electrode 15 and source electrode 16 formed on the gate insulating layer 13, as shown in FIG. 1; and (B) a alignment embodiment in which the liquid crystal molecule is aligned in orthogonal to a film thickness direction of the drain electrode 15 and source electrode 16 formed on the gate-insulating layer 13, also standing abreast in between the drain electrode 15 and source electrode 16, as shown in FIG. 2.

As alignment means, the following means can be listed; a means in which a liquid crystal alignment layer is formed on a base material (for example, the surface of the gate-insulating layer 13 etc.) on which the organic semiconductor layer 14 is to be formed, or subjecting the base material to alignment treatment such as rubbing etc.; or a means in which the base material is contacted to a layer subjected to an alignment treatment. The base material is subjected to treatment for forming the lipophilic and oil repellent regions in addition to this alignment treatment. However, either of the treatment may be performed previously.

(Interlayer-Insulating Layer)

The organic semiconductor device 10 is desirably provided with an interlayer-insulating layer. When the drain electrode 15 and source electrode 16 are formed on the gate-insulating layer 13, the interlayer-insulating layer is formed for the purpose of preventing pollution of the surface of the gate electrode 12. Accordingly, the interlayer-insulating layer is formed on the gate-insulating layer 13 prior to the formation of the drain electrode 15 and source electrode 16. After the source electrode 15 and drain electrode 16 are formed, the interlayer-insulating layer is processed such that a part of the layer, disposed on the upper channel region, is completely or partially removed. The region of the interlayer-insulating layer to be removed is desirably similar to the size of the gate electrode 12.

The material constituting the interlayer-insulating layer includes inorganic materials such as silicone oxide, silicone nitride and aluminum oxide, and organic materials such as polychloropyrene, polyethylene terephthalate, polyoxymethylene, polyvinyl chloride, polyvinylidene fluoride, cyanoethyl pullulan, polymethyl methacrylate, polysulfone, polycarbonate, and polyimide.

(Organic Semiconductor Device)

The organic semiconductor device of the present invention can be: formation 1—substrate/gate electrode/gate-insulating layer (also serving as an liquid crystal alignment layer)/source drain electrodes/liquid crystalline organic semiconductor layer (/protective layer); formation 2—substrate/gate electrode/gate-insulating layer/source-drain electrodes/liquid crystal alignment layer/liquid crystalline organic semiconductor layer (/protective layer); formation 3—substrate/gate electrode/gate-insulating layer (also serving as a liquid crystal alignment layer)/liquid crystalline organic semiconductor layer/source-drain electrodes (patterning)/protective layer; or formation 4—substrate/source-drain electrodes/liquid crystalline organic semiconductor layer/gate-insulating layer/gate electrode/substrate also serving as a protective layer.

In the organic semiconductor device of the present invention, since the organic semiconductor layer formed from large crystals with few structural defects can be formed easily, the organic semiconductor device exhibiting excellent effects, of having uniform charge transport property over a large area and high charge carrier mobility, can be easily obtained.

EXAMPLES

Hereinafter, the present invention is described in more detail based on Examples and Comparative Examples. The present invention is not limited to the following Examples.

Example 1

By using a phenyl naphthalene derivative (2-(4'-pentylphenyl)-6-metyloxynaphthalene. Hereinafter, this may be abbreviated as 5-PNP-O1.), which is the compound shown in the above chemical formula 39, as the organic semiconductor material, the organic semiconductor device was prepared. Moreover, using this material as an organic semiconductor material, an organic semiconductor layer was prepared and each property evaluation was carried out.

(Preparation of Organic Semiconductor Device)

By using the above-described 5-PNP-O1 as an organic semiconductor material, the organic semiconductor device of Example 1 comprising substrate/gate electrode/gate-insulating layer on which a lipophilic region pattern and an oil repellent region pattern are formed (also serving as an liquid crystal alignment layer)/source-drain electrodes/organic semiconductor layer (/protective layer) was prepared.

<Substrate>

A glass substrate (thickness: 1.1 mm, Corning 1737) subjected to ultrasonic cleanings by using a neutral detergent, pure water, acetone and IPA in this order was used.

<Gate electrode>

The gate electrode was formed on the substrate by resistance heating depositing a strap-shaped pattern (electrode width: 100 μm, between electrodes: 5 mm) of Au (thickness: 300 nm) via a metal mask. A similar electrode pattern can be formed by patterning an ITO electrode by using a wet process.

<Gate-Insulating Layer>

(1) Alignment Treatment

First, a gate-insulating layer was formed and this gate-insulating layer was subjected to an alignment treatment.

(a) Case in which component molecule of organic semiconductor material is aligned in parallel to substrate surface (refer to FIG. 2); as the gate-insulating layer, a photosensitive polyimide (wherein 10 g of Toray Industries Inc. UR-3140 is diluted with 25 g of n-methylpyrolidone) was spin coated, and a terminal of the gate electrode was bared by a light-exposure development after drying at 100° C. Then, after calcinations at the maximum temperature of 350° C., the gate-insulating layer of 300 nm film thickness was formed.

The surface of the polyimide film thus formed was subjected to an alignment treatment by rubbing (using polyester rapped around a 48 mm roller as a rubbing cloth, 1200 rpm, substrate moving speed of 600 mm/min). The rubbing was carried out in each direction in parallel to and in orthogonal to the channel length direction (charge transporting direction).

(b) Case in which component molecule of liquid crystalline organic semiconductor material is aligned in perpendicular (that is, right angle direction to substrate surface) to substrate surface (refer to FIG. 1);

On the substrate provided with the electrodes, $SiO_2$ film of 100 nm was formed by RF spattering method (output; 100 W×30 min). On this substrate, since the liquid crystalline organic semiconductor material used in this Example is perpendicularly aligned, when constituting TFT, a charge, which is transported in a direction perpendicular to a molecular major axis, will be dominant.

(2) Forming Treatment of a Lipophilic Region Pattern and an Oil Repellent Region Pattern:

Next, on the gate-insulating layer subjected to the alignment treatment, the following formation treatment of a lipophilic region pattern and an oil repellent region pattern was carried out.

By carrying out an ultrasonic cleaning, for 20 minutes by using sodium carbonate, to the entire surface of the gate-insulating layer subjected to the alignment treatment, hydrophilic property was given to the entire surface of the gate-insulating layer. Next, by heating at 120° C. for 2 hours after coating silane coupling agent, alkyl chains on the entire surface of the gate-insulating layer were chemically absorbed to give hydrophobic property. After that, this gate-insulating surface was masked, with a formed mask pattern of 4 mm×100 μm rectangle, to obtain an arrangement in which channels are formed in between the source•drain electrodes formed later. Over the mask, polystyrene (5 wt % toluene solution) was coated by the spin coating method to protect the above-described alkyl chains. By removing the mask, and immersing into 5 wt % sodium hydroxide solution for 60 minutes, the alkyl chains of the masked region were removed to give the oil repellent region. Finally, by dissolving the polystyrene with dichloromethyl, the region which was not masked was made to be the lipophilic region.

<Source•Drain Electrodes>

Using a metal mask, Pt was formed by resistance heating deposition (electrode thickness: 20 nm) as source•drain electrode pat (channel length: 50 μm, channel width: 4 mm). For an extraction electrode from the source-drain electrode pad, Al was used.

<Liquid Crystalline Organic Semiconductor Layer>

Using 5-PNP-O1 as the liquid crystalline organic semiconductor material and p-xylene as a solvent, 1 wt % organic semiconductor layer forming solution was prepared. The organic semiconductor layer of 400 nm thickness was obtained by dropping this organic semiconductor layer forming solution the lipophilic region on the gate-insulating layer in atmosphere of ambient pressure at temperature of 15° C., forming crystals by evaporating the solvent for about 5 hours.

(Evaluation of Charge Carrier Mobility)

To evaluated the charge carrier mobility of the organic semiconductor layer, field effect mobility (in parallel direction to the layer surface) of the organic semiconductor device in Example 1 was measured.

The organic semiconductor device in Example 1 for evaluating the charge transport property is the above-described organic semiconductor device in which the component molecule of the liquid crystalline organic semiconductor material is aligned in vertical to the substrate surface (refer to FIG. 1).

For this organic semiconductor device, by applying voltage in a range of 0 to −30 V in between source-drain (Vds) and 0 to −30 V of gate voltage (Vg), variation of current in between the source-drain (Ids) due to the application of gate voltage (Vg) was measured and evaluated.

As the result, high value of $10^{-3}$ to $10^{-2}$ cm$^2$/V·s was obtained as the charge carrier mobility.

(Evaluation of Crystal State)

To evaluate the crystal state of the organic semiconductor layer, photographs by a polarizing microscope of the organic semiconductor layer in Example 1 was observed.

For the property evaluation, the organic semiconductor layer was prepared by: using 1 mm×1 mm square pattern as a mask pattern; subjecting a glass substrate to the similar treatment as the forming treatment of a lipophilic region pattern and an oil repellent region pattern in the above-described preparation of organic semiconductor device; dropping 1 wt % p-xylene solution of 5-PNP-O1 to the lipophilic region on the glass substrate, at atmosphere temperature of 10° C. under ambient pressure; and evaporating the solvent for about 7 hours.

This evaluation of crystal state was carried out using a polarizing microscope (manufactured by Nikon Corporation, model number: OPTIPHOT2-POL).

FIG. 5 is a photograph by a polarizing microscope of the organic semiconductor layer in Example 1. By observing this photograph by the polarizing microscope, it was confirmed that the organic semiconductor layer in Example 1 is high in transparency, and the layer is formed from large crystals with area in millimeter order.

(Evaluation of Structural Defect Density)

To evaluate structural defect density of the organic semiconductor layer, measurement result of fixed light current of the organic semiconductor layer in Example 1 was observed.

The organic semiconductor layer for this property evaluation was prepared by: using 4 mm×100 μm rectangle pattern as a mask pattern; subjecting a glass substrate, on which a comb shaped ITO electrode (between the comb L=30 μm, comb width W=10 mm) is formed, to the similar treatment as the forming treatment of a lipophilic region pattern and an oil repellent region pattern in the above-described preparation of organic semiconductor device; dropping 1 wt % p-xylene solution of 5-PNP-O1 to the lipophilic region on the glass substrate, at atmosphere temperature of 10° C. under ambient pressure; and evaporating the solvent for about 7 hours.

Next, for these organic semiconductor layers, variation of photocurrent over time was evaluated by applying voltage to the comb shaped ITO electrode and exposing to light of 300 to 400 nm wavelength.

Figure 8:
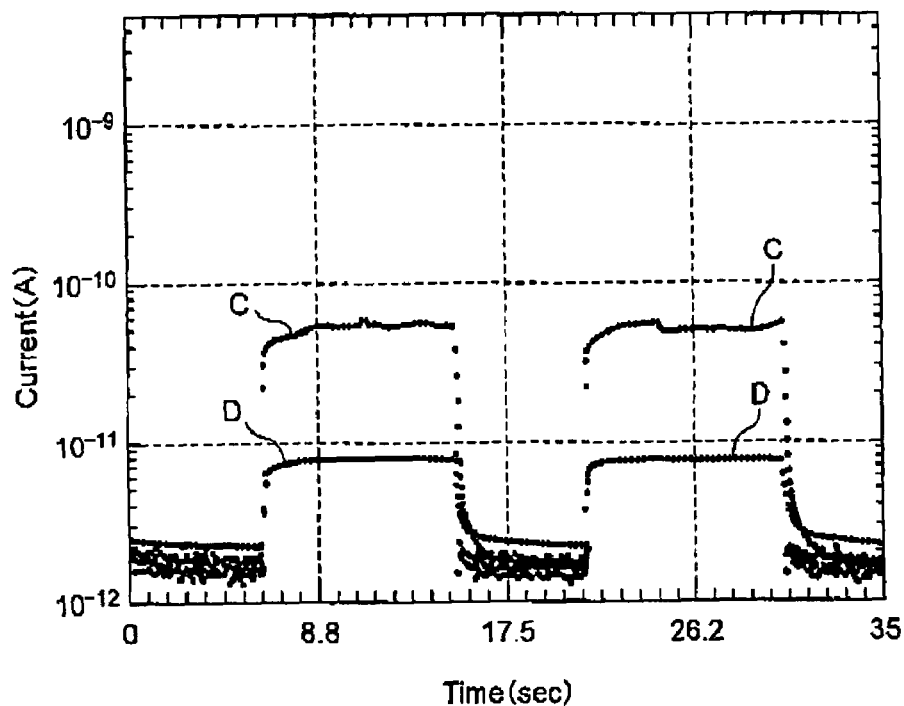
FIG. 8: C is a measurement result of fixed light current of the organic semiconductor layer in Example 1, and D is a measurement result of fixed light current of the organic semiconductor layer in Example 2.

In FIG. 8, C is a measurement result of fixed light current of the organic semiconductor layer in Example 1. From this figure, it is clear that the photocurrent rises and drops rapidly. From this fact, it is considered that the crystal forming the organic semiconductor layer in Example 1 has few structural defects.

(Evaluation of Crystal System)

Figure 9:
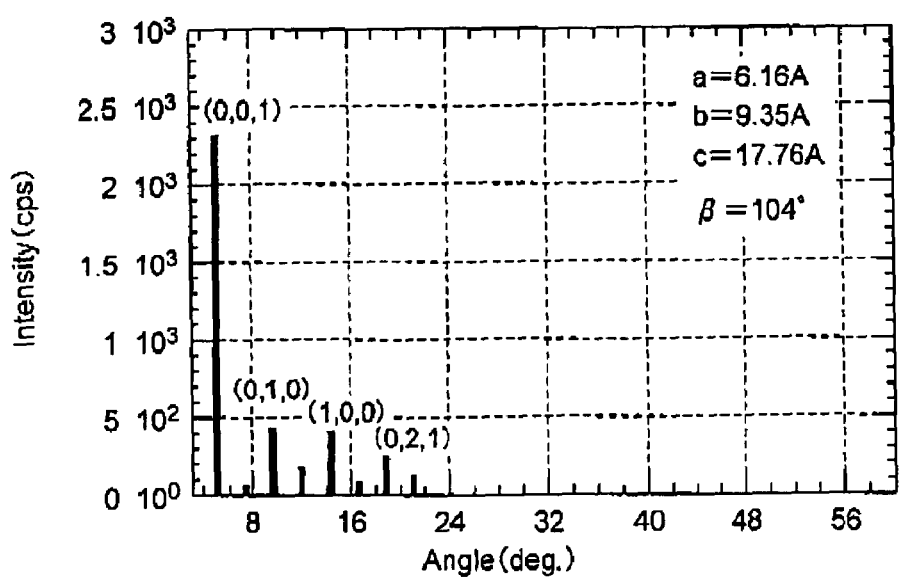
FIG. 9 is an X-ray diffraction result of the organic semiconductor layer in Example 1.

For the organic semiconductor layer in Example 1 used for the evaluation of crystal state, crystal structure was analyzed with an X-ray diffraction device (manufactured by Rigaku Corporation, model number; RAD-B). FIG. 9 is an X-ray diffraction result of the organic semiconductor layer in Example 1. From this result, it is suggested that the liquid crystal molecule forming the organic semiconductor layer in Example 1 is standing vertically to the base material. The reason for the liquid crystal forming the organic semiconductor layer in Example 1 becomes such crystal is thought to be that the liquid crystal molecule of the liquid crystalline organic semiconductor material in the coated solution is aligned along the hydrophobic group formed vertically on the base material. Therefore, in the organic semiconductor layer in Example 1, it is thought that the liquid crystal molecule is aligned in parallel to the thickness direction of the drain electrode and source electrode and crystallized, even though the alignment treatment is not carried out.

Example 2

For the organic semiconductor layer in Example 2 in which a phenyl naphthalene derivative (2-(4'-octylphenyl)-6-dodecyloxynaphthalene. Hereinafter, this may be abbreviated as 8-PNP-O12.), which is the compound shown in the above chemical formula 40, is used as the organic semiconductor material, each property evaluation as similar to Example 1 was carried out.

The organic semiconductor layer for evaluation of charge carrier mobility and evaluation of structure defect density was prepared by using 4 mm×100 mm rectangle pattern as a mask pattern; subjecting a glass substrate, on which a comb shaped Au electrode (between the comb L=200 μm, comb width W=28 mm) is formed, to the similar treatment as the forming treatment of a lipophilic region pattern and an oil repellent region pattern in the above-described preparation of organic semiconductor device in Example 1; dropping 1 wt % p-xylene solution of 8-PNP-O12 to the lipophilic region on the glass substrate, at atmosphere temperature of lot under ambient pressure; and evaporating the solvent for about 7 hours.

For the evaluation of crystal state and evaluation of crystal system, the organic semiconductor layer was prepared by: using 1 mm×1 mm square pattern as a mask pattern; subjecting a glass-substrate to the similar treatment as the forming treatment of a lipophilic region pattern and an oil repellent region pattern in the above-described preparation of organic semiconductor device in Example 1; dropping 1 wt % p-xylene solution of 8-PNP-O12 to the lipophilic region on the glass substrate, at atmosphere temperature of 10° C. under ambient pressure; and evaporating the solvent for about 7 hours.

Result of each evaluation is shown below.

In the evaluation of charge carrier mobility, charge carrier mobility of a region, in which non-linear current component increased as voltage application and trap-free space charge limited current is observed, is high value as $3\times10^{-3}$ cm$^2$/V—s.

Figure 6:
FIG. 6 is a photograph by a polarizing microscope of the organic semiconductor layer in Example 2.

In the evaluation of crystal state, it was confirmed that, as shown in FIG. 6, the organic semiconductor layer in Example 2 is high in transparency, and the layer is formed from large crystals with area in millimeter order.

In the evaluation of structural defect density, as shown by D in FIG. 8, it is clear that the fixed light current of the organic semiconductor layer in Example 2 rises and drops rapidly. From this fact, it is considered that the crystal forming the organic semiconductor layer in Example 2 has few structural defects.

Figure 10:
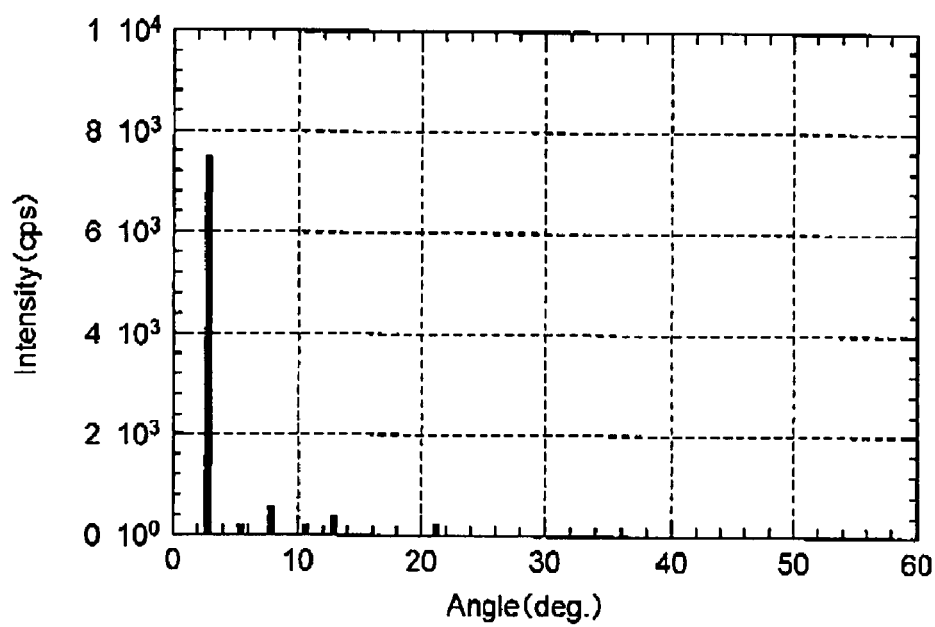
FIG. 10 is an X-ray diffraction result of the organic semiconductor layer in Example 2.

In the evaluation of crystal system, from FIG. 10, it is suggested that the liquid crystal molecule forming the organic semiconductor layer in Example 2 is standing vertically to the base material as in the case of Example 1. Therefore, also in the organic semiconductor layer in Example 2, it is thought that the liquid crystal molecule is aligned in parallel to the thickness direction of the drain electrode and source electrode and crystallized, even though the alignment treatment is not carried out.

What is claimed is:

1. A manufacturing method of an organic semiconductor device structure, wherein the organic semiconductor device structure comprises, on a base material, an organic semiconductor layer formed from a liquid crystalline organic semiconductor material,
   comprising processes of: forming an oil repellent region and a lipophilic region, which is surrounded by the oil repellent region, on the base material;
   coating an organic semiconductor layer forming solution, comprising the liquid crystalline organic semiconductor material and a solvent, on the lipophilic region; and
   crystallizing the liquid crystalline organic semiconductor material by evaporating the solvent in the organic semiconductor layer forming solution coated on the lipophilic region.

2. An organic semiconductor device structure, wherein an organic semiconductor layer in crystal phase, which is formed from a liquid crystalline organic semiconductor material, is formed on a base material, and
   the base material comprises an oil repellent region and a lipophilic region surrounded by the oil repellent region, and the organic semiconductor layer is formed on the lipophilic region.

3. The organic semiconductor device structure according to claim 2, wherein a surface of the base material, on which the organic semiconductor layer is formed, is subjected to an alignment treatment.

4. An organic semiconductor device comprising at least: a substrate; a gate electrode; a gate-insulating layer; an organic semiconductor layer in crystal phase, which is formed from a liquid crystalline organic semiconductor material, formed on the substrate; a drain electrode; and a source electrode,
   wherein the substrate comprises an oil repellent region and a lipophilic region surrounded by the oil repellent region, and the organic semiconductor layer is formed on the lipophilic region.

5. An organic semiconductor device comprising at least: a substrate; a gate electrode; a gate-insulating layer; an organic semiconductor layer in crystal phase, which is formed from a liquid crystalline organic semiconductor material, formed on the gate-insulating layer; a drain electrode; and a source electrode,
   wherein the gate-insulating layer comprises an oil repellent region and a lipophilic region surrounded by the oil repellent region, and the organic semiconductor layer is formed on the lipophilic region.

6. The organic semiconductor device according to claim 4, wherein the liquid crystal molecule in the liquid crystalline organic semiconductor material is aligned in parallel to a film thickness direction of the drain electrode and the source electrode formed on the gate-insulating layer.

7. The organic semiconductor device according to claim 5, wherein the liquid crystal molecule in the liquid crystalline organic semiconductor material is aligned in parallel to a film thickness direction of the drain electrode and the source electrode formed on the gate-insulating layer.

8. The organic semiconductor device according to claim 4, wherein the liquid crystal molecule in the liquid crystalline organic semiconductor material is aligned in orthogonal to a film thickness direction of the drain electrode and the source electrode formed on the gate-insulating layer, also standing abreast in between the drain electrode and the source electrode.

9. The organic semiconductor device according to claim 5, wherein the liquid crystal molecule in the liquid crystalline organic semiconductor material is aligned in orthogonal to a film thickness direction of the drain electrode and the source electrode formed on the gate-insulating layer, also standing abreast in between the drain electrode and the source electrode.

* * * * *